(12) United States Patent
Wong et al.

(10) Patent No.: US 11,023,020 B2
(45) Date of Patent: Jun. 1, 2021

(54) CARRIER FOR ONE OR MORE SOLID STATE DRIVES (SSDS)

(71) Applicant: SMART Embedded Computing, Inc., Tempe, AZ (US)

(72) Inventors: Suzanne Marye Wong, Tempe, AZ (US); Kendra Renee Konopka, Gilbert, AZ (US)

(73) Assignee: SMART Embedded Computing, Inc., Tempe, AZ (US)

( * ) Notice: Subject to any disclaimer, the term of this patent is extended or adjusted under 35 U.S.C. 154(b) by 0 days.

(21) Appl. No.: 16/667,975

(22) Filed: Oct. 30, 2019

(65) Prior Publication Data

US 2021/0132667 A1 May 6, 2021

(51) Int. Cl.
| G06F 1/16 | (2006.01) |
| G06F 1/18 | (2006.01) |
| H05K 5/02 | (2006.01) |
| H05K 7/14 | (2006.01) |

(52) U.S. Cl.
CPC .............. *G06F 1/183* (2013.01); *G06F 1/182* (2013.01); *H05K 5/0221* (2013.01); *H05K 5/0286* (2013.01); *H05K 7/1424* (2013.01); *H05K 7/1427* (2013.01)

(58) Field of Classification Search
CPC .... H05K 7/023; H05K 7/1424; H05K 7/1427; G06F 1/183; G06F 1/184; G06F 1/186; G06F 1/187
USPC .... 361/679.31, 679.32, 679.37–679.39, 730, 361/732, 741, 747
See application file for complete search history.

(56) References Cited

U.S. PATENT DOCUMENTS

| 5,338,214 A * | 8/1994 | Steffes ................... G06F 1/184 361/679.32 |
| 5,513,329 A * | 4/1996 | Pecone ................. G06F 13/409 361/679.32 |
| 5,831,821 A * | 11/1998 | Scholder ................. G06F 1/184 361/679.32 |
| 5,991,158 A * | 11/1999 | Chan ....................... G06F 1/184 361/736 |
| 6,491,526 B2 * | 12/2002 | Leman .................... G06F 1/184 361/752 |
| 9,629,291 B1 * | 4/2017 | Chen ....................... H05K 13/04 |
| 9,927,851 B2 * | 3/2018 | Potter ...................... G06F 1/187 |
| 10,356,930 B2 * | 7/2019 | Schulze .................... H05K 7/18 |
| 10,622,026 B1 * | 4/2020 | Tsorng ................. H05K 5/0282 |
| 2007/0144983 A1 * | 6/2007 | Fan ....................... H05K 7/1424 211/26 |
| 2012/0002364 A1 * | 1/2012 | Goodman ............... G06F 1/187 361/679.33 |

(Continued)

*Primary Examiner* — Anthony Q Edwards
(74) *Attorney, Agent, or Firm* — Harness, Dickey & Pierce, P.L.C.

(57) ABSTRACT

A housing assembly for a solid state drive (SSD) includes a carrier cage configured to be fixed to a riser board, the carrier cage including a peripheral wall having at least one carrier slot. A carrier tray configured to house the SSD includes an interior compartment at least partially defined by the walls of the carrier tray. A first fixture is disposed at a first end of the carrier tray to engage the SSD. A second fixture is disposed at the second end of the carrier tray, opposite the first end, to engage the SSD, wherein the carrier tray is removably disposed within the carrier slot of the carrier cage.

18 Claims, 6 Drawing Sheets

(56) References Cited

U.S. PATENT DOCUMENTS

| | | | |
|---|---|---|---|
| 2013/0180935 A1* | 7/2013 | Lee .......................... | G06F 1/187 |
| | | | 211/41.12 |
| 2013/0335911 A1* | 12/2013 | Pang ....................... | G06F 1/185 |
| | | | 361/679.32 |
| 2014/0139993 A1* | 5/2014 | Liu ........................ | G11B 33/128 |
| | | | 361/679.31 |
| 2016/0041590 A1* | 2/2016 | Yu .......................... | G06F 1/185 |
| | | | 361/679.32 |
| 2016/0157379 A1* | 6/2016 | Du ........................ | G11B 33/124 |
| | | | 211/26 |
| 2016/0259754 A1* | 9/2016 | Ping .................... | G06F 13/4022 |
| 2016/0299545 A1* | 10/2016 | May ......................... | G06F 1/20 |
| 2017/0094822 A1* | 3/2017 | Chen ..................... | H05K 7/1489 |
| 2017/0277230 A1* | 9/2017 | Samper .................. | G06F 1/183 |
| 2018/0077815 A1* | 3/2018 | Schulze ................ | H05K 7/1425 |
| 2018/0165244 A1* | 6/2018 | Jimenez .............. | G06F 13/4022 |
| 2018/0373664 A1* | 12/2018 | Vijayrao ............. | G06F 13/4022 |
| 2019/0250679 A1* | 8/2019 | Nguyen ............... | G11B 33/126 |
| 2020/0084907 A1* | 3/2020 | Norton .................... | G06F 1/185 |

\* cited by examiner

CARRIER FOR ONE OR MORE SOLID STATE DRIVES (SSDS)

FIELD

The present disclosure relates to a carrier or housing assembly for one or more solid state drives (SSDs), and more particularly for carrier for one or more SSDs in an electrical enclosure.

BACKGROUND

This section provides background information related to the present disclosure which is not necessarily prior art.

Some computer systems include one or more solid state drives (SSDs). SSDs are connected to a motherboard through a riser card within a chassis or computer case. It may be desirable to replace an SSD, for example when the memory is full or to upgrade to a larger capacity.

SUMMARY

This section provides a general summary of the disclosure, and is not a comprehensive disclosure of its full scope or all of its features.

A housing assembly for at least one solid state drive (SSD) includes a carrier cage, which includes a peripheral wall defining at least one carrier slot. The carrier cage is fixed to a riser board. The housing assembly includes a tray having a first end, a second end opposite the first end, a first side wall extending between the first end and the second end, and a second side wall extending between the first end and the second end and is disposed opposite the first side wall. The carrier tray also includes a front wall disposed on the first end and extending between the first side wall and the second side wall and an interior compartment at least partially defined by the first side wall, the second side wall, and the front wall. The interior compartment houses at least one SSD. The carrier tray also includes a first fixture which is disposed at the first end and engages at least one SSD. The carrier try also includes a second fixture disposed at the second end and engaging at least one SSD, wherein the carrier tray is removably disposed within the carrier slot of the carrier cage.

A computer case includes a chassis which has an outside wall defining an inner area. The computer case also includes a motherboard disposed within the inner area of the computer case. A riser board which is disposed within the inner area of the computer case is physically and electrically connected to the mother board, and includes at least one connector which receives a mating connector of at least one SSD. The riser board also includes a carrier cage which is fixed to at least one of the motherboard or the riser board. The carrier cage also includes a peripheral wall at least partially defining at least one carrier slot. The carrier cage also includes at least one carrier tray which includes a first end, a second end opposite the first end, a first side wall extending between the first end and the second end, a second side wall extending between the first end and the second end and disposed opposite the first side wall, and a front wall disposed on the first end of the carrier tray and extending between the first side wall and the second side wall. The carrier tray also includes an interior compartment which is at least partially defined by the first side wall, the second side wall, and the front wall. The interior compartment houses at least one SSD. The carrier tray includes a first fixture which is disposed at the first end and engages at least one SSD and a second fixture which is disposed at the second end and is configured to engage at least one SSD, wherein the carrier tray is removably disposed within at least one carrier slot of the carrier cage.

A method of assembling a computer case includes disposing a SSD having a first end and a second end opposite the first end in an interior compartment of a carrier tray. The carrier tray includes a first end, a second end opposite the first end, a first side wall extending between the first end and the second end, and a second side wall extending between the first end and the second end and disposed opposite the first side wall. A front wall is disposed on the first end and extends between the first side wall and the second side wall, and a bottom wall extends between the first side wall and the second side wall. The interior compartment is at least partially defined by the first side wall, the second side wall, the front wall, and the bottom wall. A first fixture is disposed at the first end, and a second fixture is disposed at the second end. The method of assembling a computer case also includes fixing the first end of the SSD to the first fixture of the carrier tray and fixing a second end of the SSD opposite the first end of the SSD to the second fixture of the carrier tray. The second end of the SSD includes a connector, and the method further includes disposing the second end of the carrier tray toward a carrier slot of a carrier cage. The carrier cage includes a peripheral wall defining the carrier slot, a first guide rail projecting from the peripheral wall into the carrier slot, and a second guide rail projecting from the peripheral wall into the carrier slot. The method further includes engaging the bottom wall of the carrier tray with the first and second guide rails, and sliding the carrier tray into the carrier slot until the connector of the SSD is received in a mating connector or a riser board.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

As discussed above, in certain situations, it may be desirable to remove a SSD from a computer case assembly and/or install a new SSD. SSDs are typically removed from a chassis of a computer case by removing a lid of the chassis and disconnecting the SSD from the riser card or motherboard. An electrical connector is typically disposed at a back end of the SSD and the SSD is secured with a fastener at a front end of the SSD.

In various aspects, the present disclosure provides a carrier or housing assembly for one or more SSDs. The housing assembly may include a carrier cage that is fixed to a riser board within a chassis of a computer case assembly. One or more carrier trays for housing SSDs may be slidably disposed within the carrier cage. The carrier trays may be removable from the outside of the chassis so that SSDs can be removed and/or replaced without disassembling the chassis. The carrier tray may include an alignment feature for ensuring a proper physical and electrical connection between the SSDs and the riser board. Thus, unlike in conventional systems, SSDs can be quickly and simply replaced by a relatively inexperienced user with minimal chance of damage to components (e.g., electrical connectors) or improper installation of components.

Each carrier tray may hold one or more SSDs. The SSDs may be supported on both a front end of the carrier tray and a back end of the carrier tray. Therefore, when compared to typical systems that include a single front fixture, the carrier tray of the present disclosure may provide a more secure mounting system. In addition, the carrier tray can be locked within the carrier cage to prevent the carrier tray from sliding out of the carrier cage. These features may enable the SSDs housed in the housing assembly of the present disclosure to be more resistant to becoming loose during vibration than in conventional systems.

Figure 1:
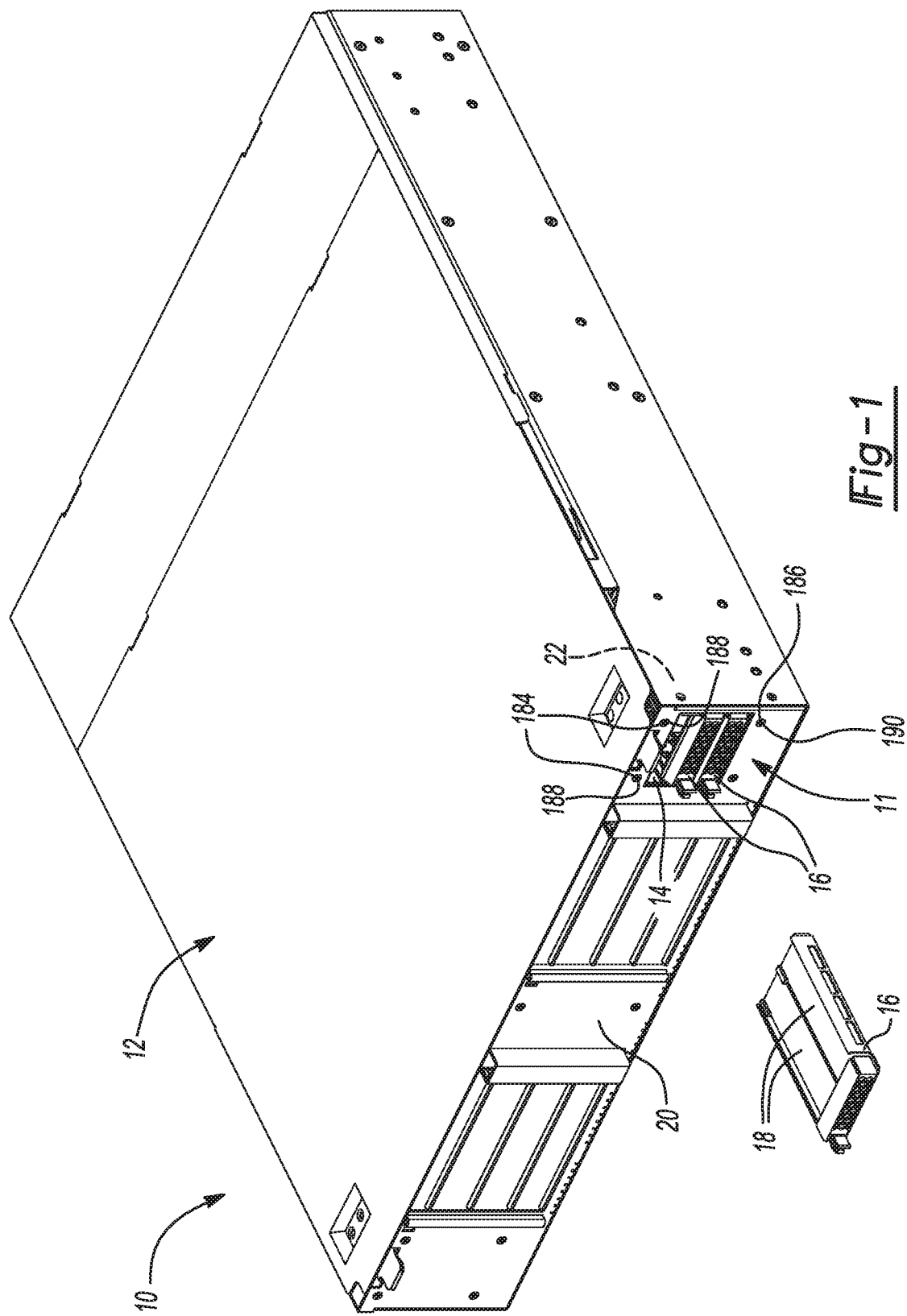
FIG. 1 is a perspective view of a computer case assembly including a housing assembly for a solid state drive (SSD) in accordance with the present disclosure.

Referring to FIG. 1, a computer case assembly 10 in accordance with the present disclosure is provided. The computer case assembly 10 may include a chassis 12 and a housing assembly 11. The housing assembly 11 may include a carrier cage 14, one or more carrier trays 16, and one or more SSDs 18. The chassis 12 may include an outside wall 20 defining an inner area 22. As will be described in greater detail below, the carrier cage 14 may be at least partially disposed within the inner area 22 of the chassis 12. The carrier trays 16 may be removably housed in the carrier cage 14. The SSDs 18 may be disposed in the carrier trays 16. The SSDs 18 may be accessible from outside of the chassis 12 by removal of the carrier tray 16 from the carrier cage 14. Although the computer case assembly 10 includes one carrier cage 14, the computer case assembly 10 may have other quantities of carrier cages 14. By way of non-limiting example, the computer case assembly 10 may include two carrier cages 14.

Figure 2:
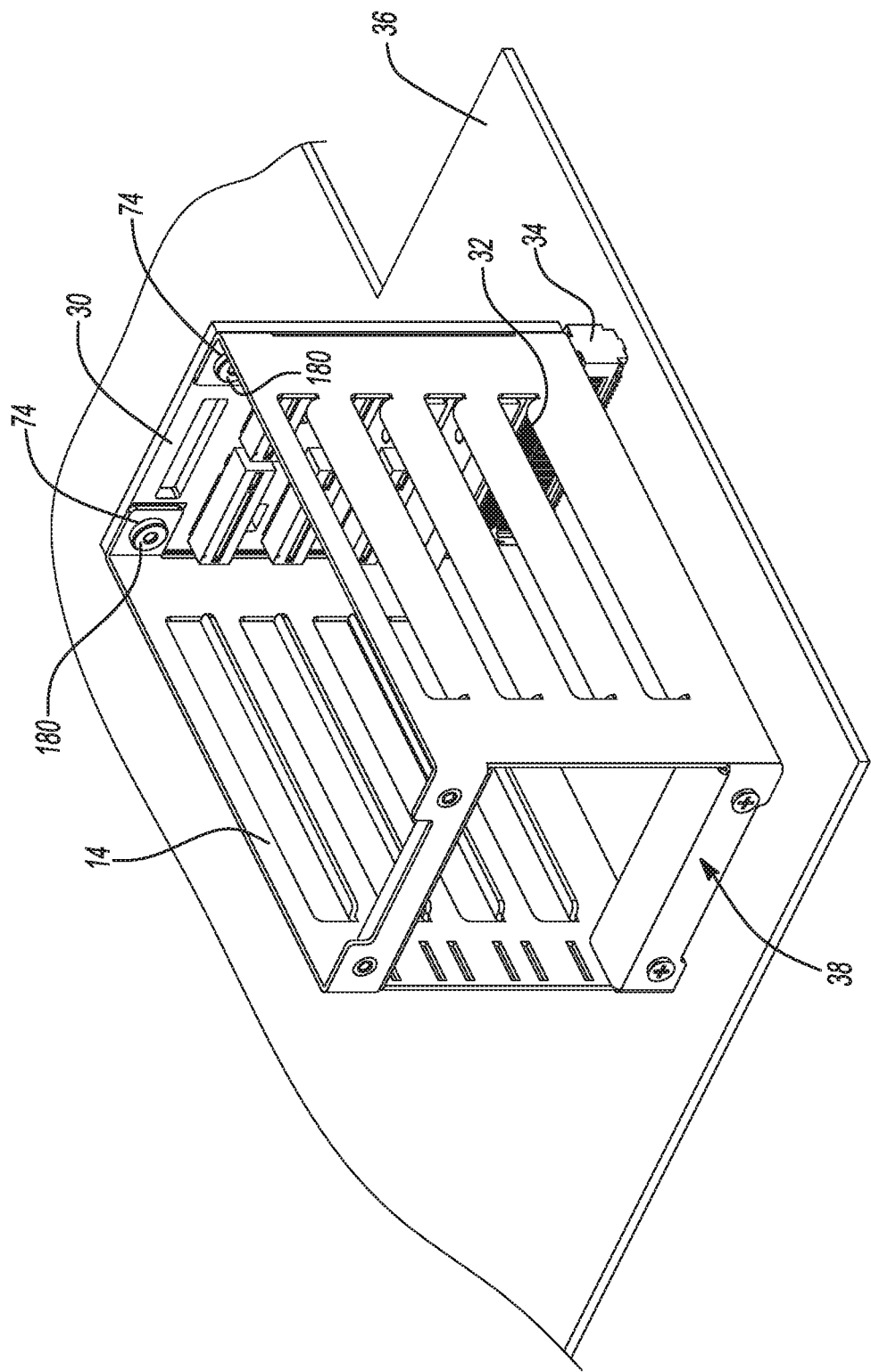
FIG. 2 is a front right perspective view of the housing assembly of FIG. 1 including a carrier cage assembled to a riser board.

With reference to FIG. 2, the carrier cage 14 may be fixed to a riser board 30. The riser board 30 may include a connector 32 that is physically and electrically connected to a mating connector 34 on a motherboard 36. The motherboard 36, the riser board 30, and the carrier cage 14 may all be at least partially disposed within the inner area 22 of the chassis 12. In one example, the motherboard 36 and the riser board 30 may be fully disposed within the inner area 22 of the chassis 12. The carrier cage 14 may be partially disposed within the inner area 22 of the chassis such that a front side 38 of the carrier cage 14 is exposed to and accessible from an outside of the chassis 12 (FIG. 1).

Figure 3:
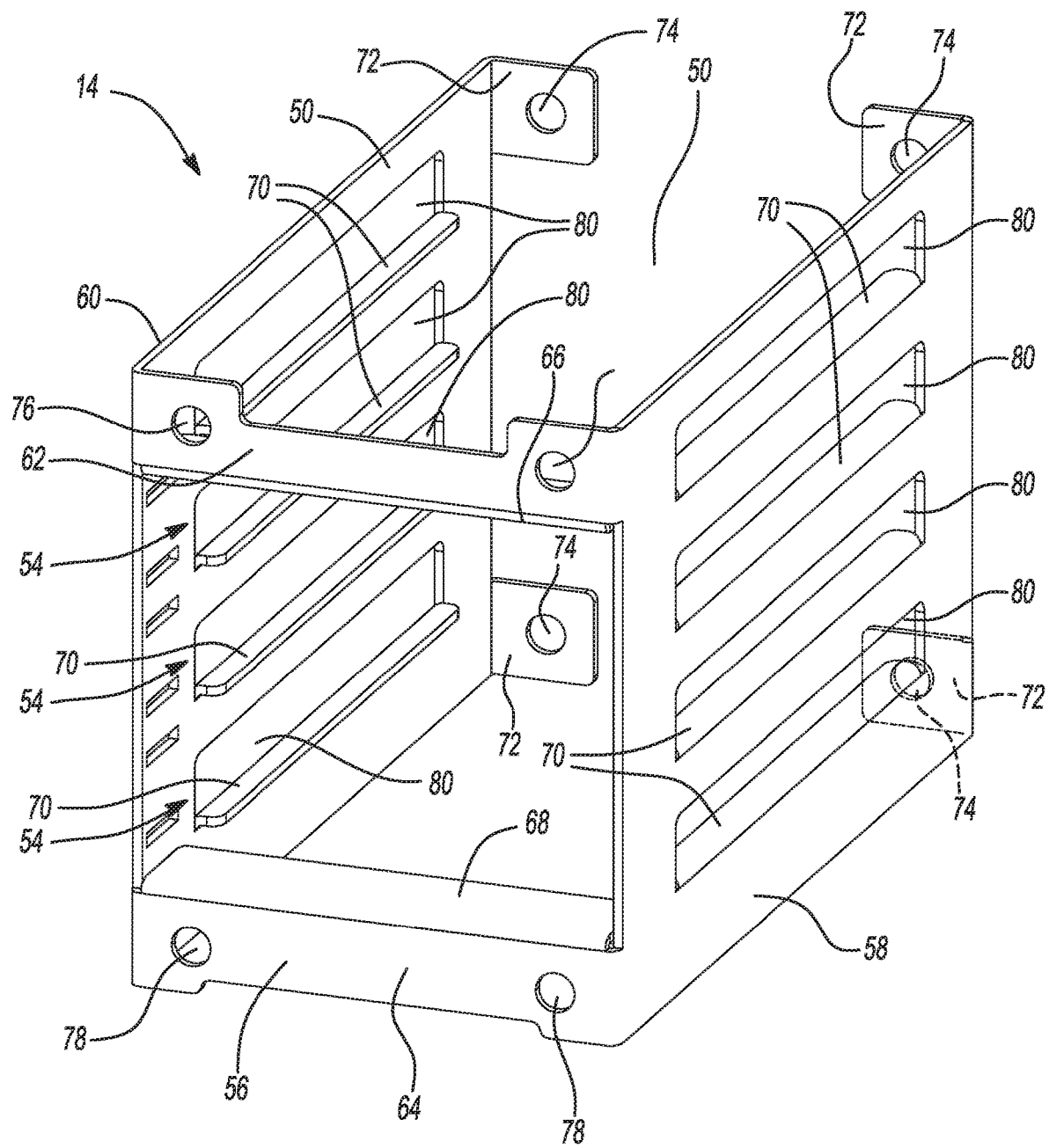
FIG. 3 is a front right perspective view of the carrier cage of FIG. 2.

Referring to FIG. 3, the carrier cage 14 may include a peripheral wall 50. The peripheral wall 50 may define an inner area 52. The inner area 52 may include one or more carrier slots 54. In one example, the inner area 52 includes three carrier slots 54. The carrier slots 54 may be disposed vertically such that they are stacked on top of one another.

The peripheral wall 50 may include a front wall 56, a first or right side wall 58, and a second or left side wall 60. The first side wall 58 may be disposed opposite the second side wall 60 and substantially parallel to the second side wall 60. The first side wall 58 and the second side wall 60 may extend substantially perpendicular to the front wall 56. The front wall 56 may include a top face panel 62 and a bottom face panel 64. Top and bottom guide panels 66, 68 may extend from respective top and bottom face panels 62, 64. The guide panels 66, 68 may extend substantially perpendicular to the top and bottom face panels 62, 64 into the inner area 52 of the carrier cage 14. The top and bottom guide panels 66, 68 may extend substantially parallel to one another.

Each of the first side wall 58 and the second side wall 60 may include one or more inwardly-extending guide rails 70. Each guide rail 70 may project from a side wall 58, 60 of the peripheral wall 50 into the inner area 52 of the carrier cage. The guide rails 70 may extend substantially perpendicular to the side walls 58, 60. In some examples, each side wall 58, 60 may include a quantity of guide rails 70 that is equal to one more than the quantity of carrier slots 54. For example, when the quantity of carrier slots 54 is three, each side wall 58 may include four guide rails 70. The guide rails 70 of the first side wall 58 may be disposed opposite the guide rails 70 of the second side wall 60 to form pairs of opposing guide rails 70. The guide rails 70 of each pair of guide rails 70 may be coplanar.

The carrier cage 14 may further include a plurality of tabs 72. Each tab 72 may be disposed substantially parallel to the face panels 62, 64 of the front wall 56. In one example, the plurality of tabs 72 may include four tabs 72. Two tabs 72 may project from the first side wall 58 toward the second side wall 60. Another two tabs 72 may project from the second side wall 60 toward the first side wall 58. The plurality of tabs 72 may define a respective plurality of first apertures 74.

The top face panel 62 may define a plurality of second apertures 76. The bottom face panel 64 may define a plurality of third apertures 78. In some examples, the plurality of second apertures 76 includes two second apertures 76 and the plurality of third apertures 78 includes two third apertures. Each side wall 56, 58 may include a plurality of openings 80. A quantity of openings 80 on each side wall 58, 60 may be equal to the quantity of guide rails 70 on each side wall 58, 60. Each opening 80 may be disposed adjacent to a respective guide rail 70. For example, each opening 80 may be disposed above a respective guide rail 70.

Figure 4:
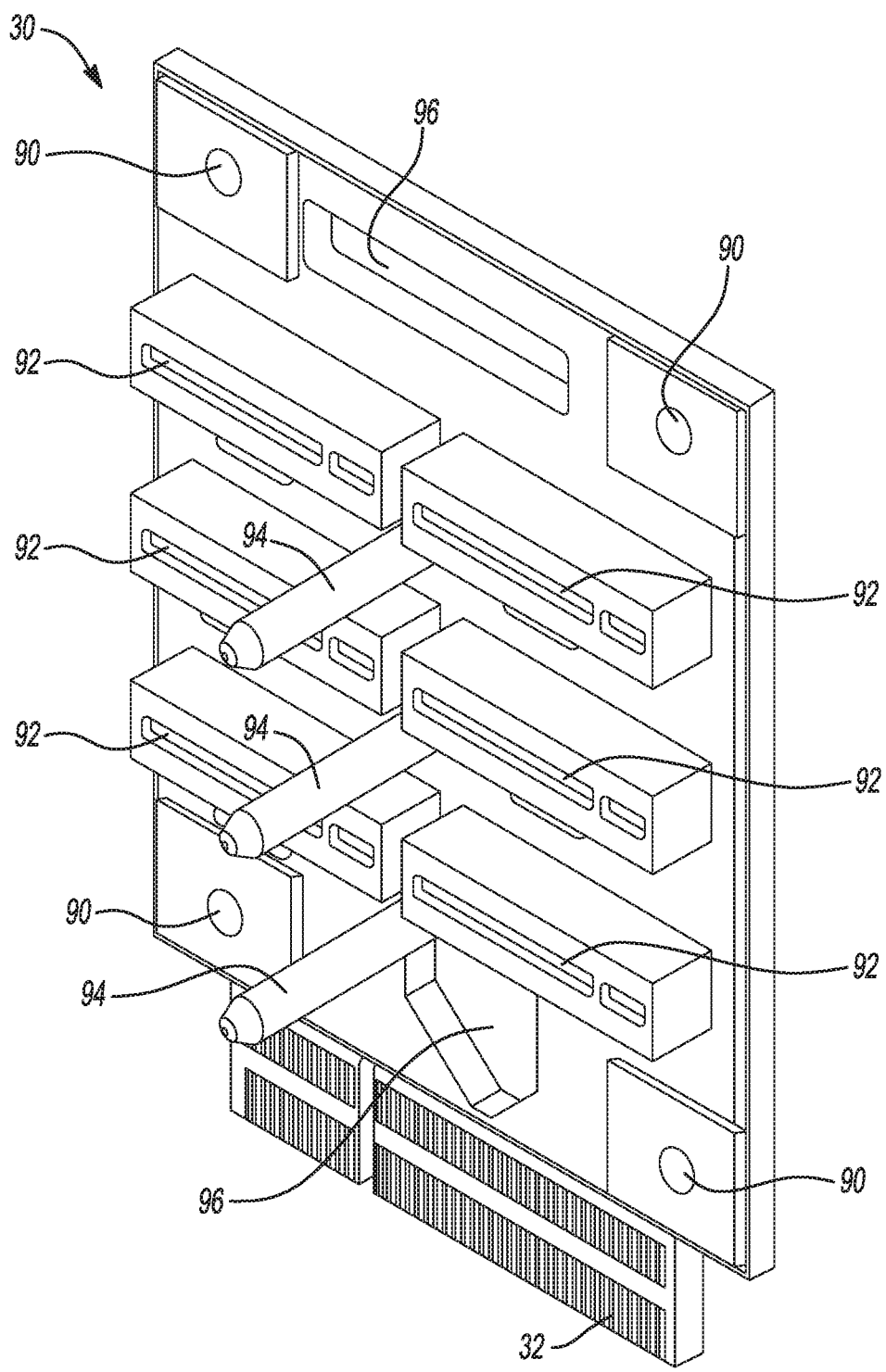
FIG. 4 is a front right perspective view of the riser board of FIG. 2

With reference to FIG. 4, the riser board 30 is shown. The riser board 30 include a plurality of fourth apertures 90. In some examples, the plurality of fourth apertures 90 may include four apertures. The riser board 30 may further include one or more SSD connectors 92 for physically and electrically connecting the one or more SSDs 18 to the riser board 30. A quantity of SSD connectors 92 may be equal to a quantity of SSDs 18. The riser board 30 may further include a plurality of pins 94. In one example, a quantity of pins 94 may be equal to a quantity of carrier trays 16 and the plurality of pins 94 may include three pins. The riser board 30 may include one or more openings 96.

Figure 5:
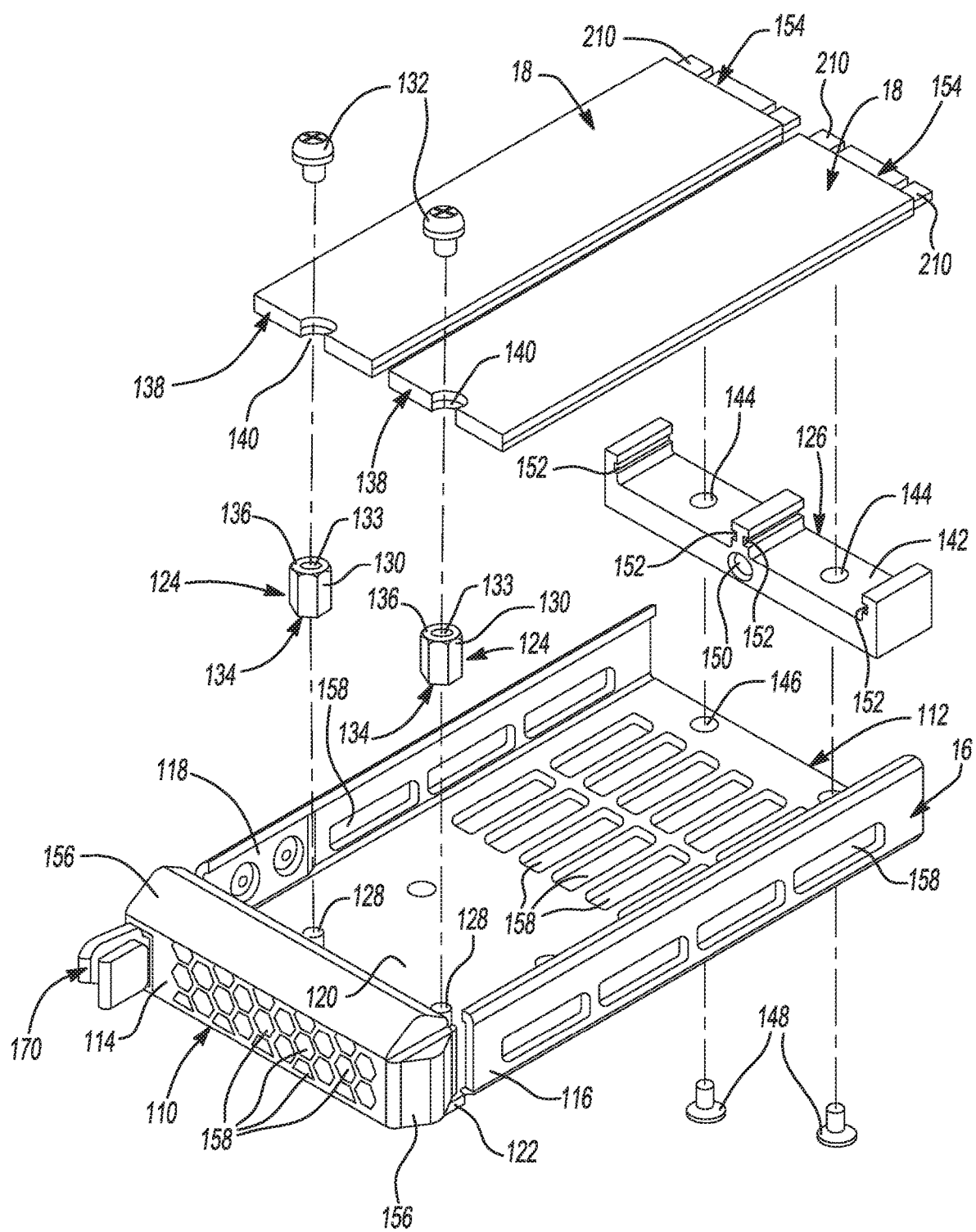
FIG. 5 is a front right exploded view of a carrier tray of the housing assembly of FIG. 1.

Referring now to FIG. 5, the carrier tray 16 is shown. The carrier tray 16 may include a first or front end 110 and a second or back end 112 opposite the front end 110. A front wall 114 may be disposed at the front end 110. The carrier tray 16 may further include a first or right side wall 116 and a second or left side wall 118. The first and second side walls 116, 118 may be substantially parallel to one another. The first and second side walls 116, 118 may be substantially perpendicular to the front wall 114. The front wall 114, the first side wall 116, and the second side wall 118 may cooperate to at least partially define an interior compartment 120. The carrier tray 16 may further include a bottom wall 122 extending between the first side wall 116 and the second side wall 118. The bottom wall 122 may extend substantially perpendicular to the front wall 114, the first side wall 116, and the second side wall 118.

The carrier tray 16 may include one or more first or front fixtures 124 disposed at the first end 110 and one or more second fixtures 126 disposed at the second end 112. The front and back fixtures 124, 126 may cooperate to support one or more SSDs 18. In one example, the carrier tray 16 may include two front fixtures 124. Each front fixture 124 may include a post 128, protrusion having a receptacle, such as a threaded nut 130, and a first fastener 132. The first fastener 132 may be a threaded fastener. The post 128 may be disposed within a threaded receptacle 133 of the nut 130. In some examples, the post 128 may be threaded and the nut 130 may be threaded onto the post 128. The nut 130 may include a first surface 134 that engages the bottom wall 122 and a second surface 136 that engages a first end 138 of the SSD 18. The first fastener 132 may extend through a fifth aperture 140 in the first end 138 of the SSD 18. The fifth aperture 140 may have a semi-circular shape such that it is not fully enclosed by a wall.

The second fixture 126 may be a guide block 142. The guide block 142 may have a first surface 144 that engages the bottom wall 122 of the carrier tray 16. The guide block may include a plurality of sixth apertures 144. The bottom wall 122 may include a plurality of seventh apertures 146. A quantity of sixth apertures 144 may be two and a quantity of the seventh apertures 146 may be two. The sixth apertures 144 may be aligned with respective seventh apertures 146. A plurality of second fasteners 148 may extend through the seventh apertures 146 and the sixth apertures 144 to fix the guide block 142 to the carrier tray 16.

The guide block 142 may include alignment feature such as eighth aperture or receptacle 150. Axes of the eighth aperture 150 may extend substantially perpendicular to axes of the sixth and seventh apertures 144, 146. The guide block 142 may further include one or more pairs of opposing grooves 152. A quantity of pairs of grooves 152 may be equal to a quantity of SSDs 18 to be housed in the carrier tray 16. A second end 154 of the SSD 18 opposite the first end 138 of the SSD may slidably engage the pair of grooves 152 to fix the SSD 18 to the carrier tray 16.

The carrier tray 16 may further include one or more electro-magnetic interference (EMI) shielding gaskets 156. The EMI shielding gaskets 156 may be disposed at the front end 110 of the carrier tray 16. For example, the EMI shielding gaskets 156 may be disposed adjacent to the front wall 114. The carrier tray 16 may further include a third plurality of openings 158. The openings 158 may extend through the front wall 114, the first side wall 116, the second side wall 118, and the bottom wall 122. The first plurality of openings 80 in the carrier cage 14, the second plurality of openings 96 in the riser board 30, and the third plurality of openings 158 in the carrier tray 16 may permit airflow around the SSDs 18 to facilitate cooling of the SSDs 18.

Figure 6:
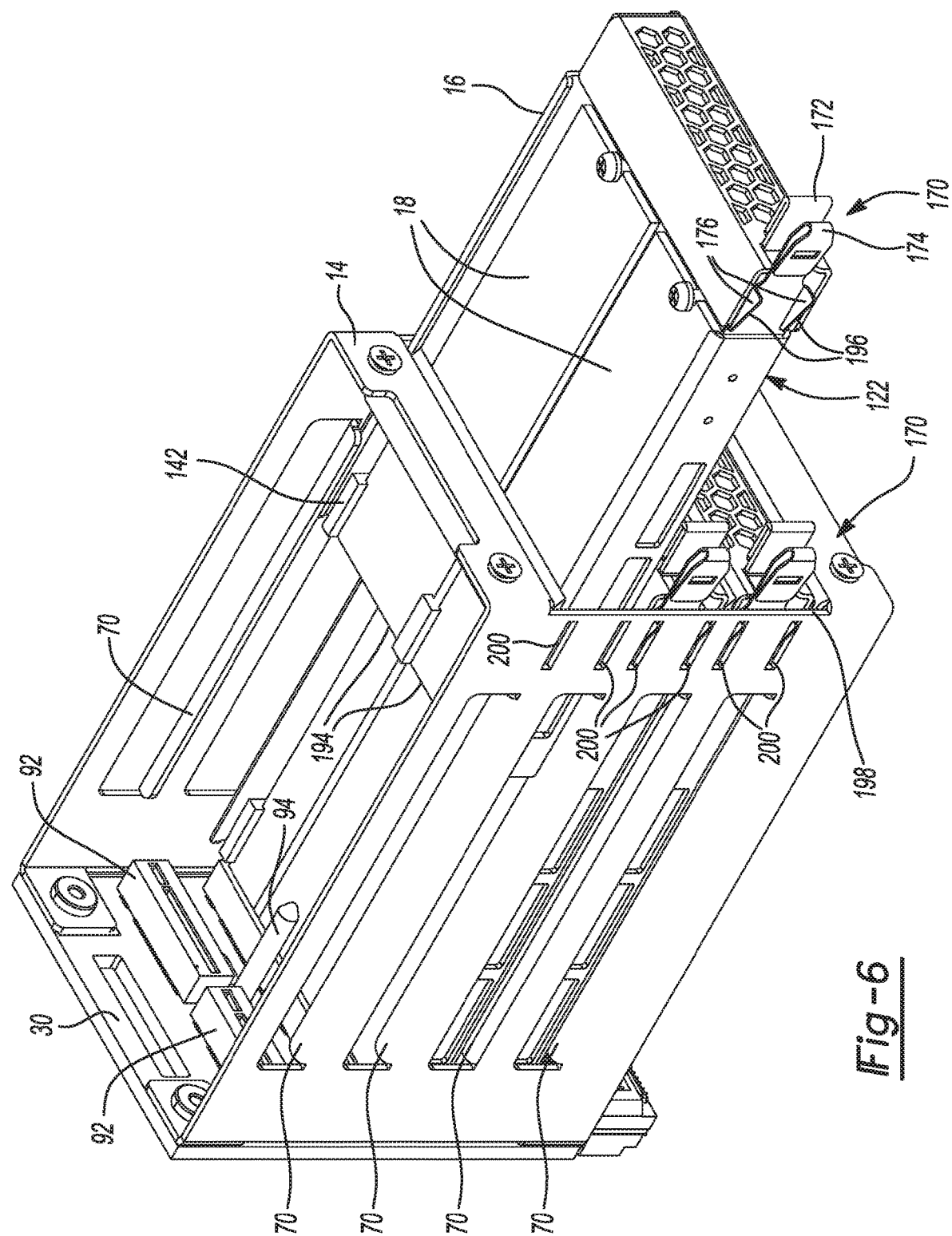
FIG. 6 is a front left perspective view of the housing assembly of FIG. 1.

As best shown in FIG. 6, the carrier tray 16 may include a locking mechanism 170. The locking mechanism 170 may include a first tab 172 extending from the front wall 114. The first tab 172 may extend substantially parallel to the second side wall 118. The locking mechanism 170 may further include a second tab 174 disposed outward of the first tab 172 with respect to the interior compartment 120 of the carrier tray 16. A spring (not shown) may be disposed between the first tab 172 and the second tab 174 of the locking mechanism 170. The second tab 174 may include one or more outwardly extending protrusions 176. Each protrusion 176 may extend substantially perpendicular to the second tab 174 and substantially parallel to the bottom wall 122. A quantity of protrusions 176 may be two.

Returning to FIG. 2, the riser board 30 may be fixed to the motherboard 36 at the connectors 32, 34. The carrier cage 14 may be fixed to the riser board 30. More specifically, the plurality of first apertures 74 of the carrier cage 14 may be aligned with the plurality of fourth apertures 90 of the riser board 30. A plurality of third fasteners 180 may extend through the respective pluralities of aligned first and fourth apertures 74, 90 to fix the carrier cage 14 to the riser board 30. Additionally or alternatively, the carrier cage 14 may be fixed to the motherboard 36 (not shown).

Returning to FIG. 1, the carrier cage 14 may be fixed to the chassis 12. The outside wall 20 of the chassis 12 may include a plurality of ninth apertures 184 and a plurality of tenth apertures 186. The second apertures 76 of the carrier cage 14 may be aligned with the ninth apertures 184 of the chassis. A plurality of fourth fasteners 118 may extend through the second and ninth apertures 76, 184. The third apertures 78 of the carrier cage 14 may be aligned with the tenth apertures 186 of the chassis 12. A plurality of fifth fasteners 190 may extend through the third and tenth apertures 78, 186.

Returning to FIG. 6, the carrier trays 16 are housed in the carrier cage 14 and are accessible from the outside of the chassis 12. To insert the carrier tray 16 into the carrier cage 14, the bottom wall 122 of the carrier tray 16 may engage the pair of guide rails 70 of the carrier cage 14. The carrier tray 16 may be pushed into the inner area 52 of the carrier cage 14. The eighth aperture 150 of the guide block 142 on the carrier tray 16 may receive the pin 94 of the riser board 30. The guide rails 70 may facilitate proper alignment of the eighth aperture 150 with the pin 94. The carrier tray 16 may be pushed further into the inner area 52 of the carrier cage 14 until the SSD connectors 92 of the riser board 30 receive mating connectors 194 at the second ends 154 of the SSDs 18.

The carrier tray 16 may be locked within the carrier cage 14 so that the SSDs 18 remain physically and electrically connected to the riser board 30 during vibration of the computer case assembly 10. As the carrier tray 16 is pushed into the inner area 52 of the carrier cage 14, the protrusions 176 of the locking mechanism 170 may engage the second side wall 60 of the carrier cage 14. The protrusions 176 may each include a ramped surface 196. As the ramped surface 196 of the protrusions 176 slides along an edge 198 of the second side wall 60, the spring of the locking mechanism 170 may be compressed or energized. When the protrusions 176 have cleared the edge 198 of the second side wall 60, the spring may bias the protrusions 176 into respective receptacles 200 of the second side wall 60 to fix the carrier tray 16 in the carrier cage 14.

The carrier trays 16 may be removable from the carrier cage 14. The second tab 174 of the locking mechanism 170 may be pivoted toward the first tab 172 of the locking mechanism 170 to compress or energize the spring. Pivoting the second tab 174 toward the first tab 172 may remove the protrusions 176 of the locking mechanism 170 from the receptacles 200 of the carrier cage 14. When the protrusions 176 are removed from the receptacles 200, the carrier tray 16 may be slidable along the guide rails 70 out of the inner area 52 of the carrier cage 14.

The SSDs can be removed or replaced from the computer case assembly 10 when the carrier tray 16 is removed from the carrier cage 14. The first fastener 132 of the first fixture 124 may be removed from the nut 130 and the fifth aperture 140 of the SSD 18 to release the first end 138 of the SSD 18. The SSD 18 may be pulled out of the opposing grooves 152 of the guide block 142 to release the second end 154 of the SSD 18.

The computer case assembly 10 is shown with one carrier cage 14 having three carrier trays 16 and two SSDs per carrier tray 16 (i.e., a first SSD and a second SSD). However, other quantities of carrier cages 14, carrier trays 16, and SSDs are contemplated. For example, the computer case assembly 10 may include two carrier cages 14, each being capable of housing, up to six SSDs 18. In another example, each carrier tray 16 may hold one SSD 18.

In various aspects, the present disclosure also provides a method of assembling the computer case assembly 10. The method may include fixing the second end 154 of the SSD 18 to the second fixture 126 of the carrier tray 16. The second end 154 of the SSD 18 may be fixed to the second fixture 126 of the carrier tray 16 by sliding opposing edges 210 on the second end 154 of the SSD 18 into the opposing grooves 152 of the guide block 142. The method may further include fixing the first end 138 of the SSD 18 to the first fixture 124 of the carrier tray 16. The first end 138 of the SSD 18 may be fixed to the first fixture 124 by placing the first end 138 of the SSD 18 on the second surface 136 of the nut 130, aligning the fifth aperture 140 of the SSD 18 with the threaded receptacle 133 of the nut 130, extending the first fastener 132 through the fifth aperture 140 and threading the first fastener 132 in to the nut 130. The SSD 18 may be fixed to the second fixture 126 prior to being fixed to the first fixture 124.

The carrier tray 16 may be inserted into the carrier cage 14, which may be disposed at least partially within the inner area 22 of the chassis 12. The back end 112 of the carrier tray 16 may be disposed toward the carrier cage 14. The carrier tray 16 may be inserted into a carrier slot 54 of the carrier cage 14 by engaging the bottom wall 122 of the carrier tray 16 with the opposing guide rails 70 of the carrier slot 54. The carrier tray 16 may be slid into the inner area 52 of the carrier cage 16 until the eighth aperture 150 of the guide block 142 receives the pin 94 of the riser board 30. The carrier tray 16 can be slid further into the inner area 52 of the carrier cage 14 until the connectors 194 of the SSDs 18 are received by the connectors 92 on the riser board 30. The protrusions 176 of the locking mechanism 170 of the carrier tray 16 may be disposed in the receptacles 200 of the carrier cage 14 to fix the carrier tray 16 within the carrier cage 14.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A housing assembly for at least one solid state drive (SSD), the housing assembly comprising:
a carrier cage including a peripheral wall defining at least one carrier slot, the carrier cage being configured to be fixed to a riser board; and
a carrier tray including:
a first end;
a second end opposite the first end;
a first side wall extending between the first end and the second end;
a second side wall extending between the first end and the second end and disposed opposite the first side wall;
a front wall disposed on the first end and extending between the first side wall and the second side wall;
an interior compartment at least partially defined by the first side wall, the second side wall, and the front wall, the interior compartment being configured to house the at least one SSD;
a first fixture disposed at the first end and configured to engage the at least one SSD;
a second fixture disposed at the second end and configured to engage the at least one SSD, wherein the carrier tray is removably disposed within the carrier slot of the carrier cage; and
a bottom wall extending between the first side wall and the second side wall, the bottom wall being disposed substantially perpendicular to the first side wall, the second side wall, and the front wall,
wherein:
the second fixture of the carrier tray is a guide block fixed to the bottom wall of the carrier tray and disposed at the second end of the carrier tray; and
the guide block includes a air of grooves configured to slidably engage a second end of the at least one SSD.

2. The housing assembly of claim 1, wherein:
the carrier cage further includes a pair of opposing guide rails projecting from the peripheral wall into the carrier slot; and
the bottom wall of the carrier tray slidably engages the pair of opposing guide rails when the carrier tray is disposed in the carrier slot.

3. The housing assembly of claim 1, wherein:
the first fixture of the carrier tray includes a threaded fastener and a protrusion;
the protrusion extends from the bottom wall into the interior compartment and includes a threaded receptacle;
the protrusion is configured to support a first end of the at least one SSD; and
the threaded fastener is configured to extend through an aperture in the at least one SSD and be received in the threaded receptacle to fix the first end of the at least one SSD to the carrier tray.

4. The housing assembly of claim 1, wherein the guide block further includes a receptacle configured to receive a pin on the riser board.

5. The housing assembly of claim 1, wherein:
the peripheral wall of the carrier cage defines a receptacle;
the carrier tray further includes a locking mechanism having a protrusion;
the protrusion is configured to engage the receptacle to lock the carrier tray within the carrier slot of the carrier cage; and
the protrusion is configured to be disengaged with the receptacle so that the carrier tray can be removed from the carrier slot of the carrier cage.

6. The housing assembly of claim 5, wherein the locking mechanism of the carrier tray further includes a spring connected to the protrusion, the spring being configured to bias the protrusion toward the receptacle when the carrier tray is disposed in the carrier slot of the carrier cage.

7. The housing assembly of claim 1, wherein the carrier tray further includes a gasket fixed to the front wall and configured to provide electro-magnetic interference (EMI) shielding to the carrier cage.

8. The housing assembly of claim 1, wherein at least one of the first side wall, the second side wall, and the front wall of the carrier tray includes a plurality of openings configured to permit airflow between the interior compartment and a region outside of the carrier tray.

9. The housing assembly of claim 8, wherein each of the first side wall, the second side wall, and the front wall includes at least one opening of the plurality of openings.

10. The housing assembly of claim 1, wherein the at least one SSD includes a first SSD and a second SSD.

11. A computer case comprising:
a chassis having an outside wall defining an inner area;
a motherboard disposed within the inner area of the computer case;
a riser board disposed within the inner area of the computer case, the riser board being physically and electrically connected to the motherboard and including at least one connector configured to receive a mating connector of at least one solid state drive (SSD);
a carrier cage fixed to at least one of the motherboard or the riser board, the carrier cage including a peripheral wall at least partially defining at least one carrier slot;
at least one carrier tray including:
a first end;
a second end opposite the first end;
a first side wall extending between the first end and the second end;
a second side wall extending between the first end and the second end and disposed opposite the first side wall;
a front wall disposed on the first end of the carrier tray and extending between the first side wall and the second side wall;
an interior compartment at least partially defined by the first side wall, the second side wall, and the front wall, the interior compartment being configured to house the at least one SSD;
a first fixture disposed at the first end and configured to engage the at least one SSD; and
a second fixture disposed at the second end and configured to engage the at least one SSD, wherein the carrier tray is removably disposed within the at least one carrier slot of the carrier cage,
wherein the second fixture of the carrier tray is a guide block fixed to a bottom wall of the carrier tray and disposed at the second end of the carrier tray.

12. The computer case of claim 11, wherein:
the peripheral wall of the carrier cage defines a receptacle;
the at least one carrier tray further includes a locking mechanism having a protrusion;
the protrusion is configured to engage the receptacle to lock the carrier tray within the carrier slot of the carrier cage; and the protrusion is configured to be disengaged with the receptacle so that the carrier tray can be removed from the carrier slot of the carrier cage.

13. The computer case of claim 11, wherein the at least one SSD includes a first SSD and a second SSD.

14. The computer case of claim 11, wherein:
the at least one carrier tray includes three carrier trays; and
the at least one carrier slot includes three carrier slots.

15. A method of assembling a computer case comprising:
disposing a solid state drive (SSD) having a first end and a second end opposite the first end in an interior compartment of a carrier tray, wherein the carrier tray includes a first end, a second end opposite the first end, a first side wall extending between the first end and the second end, a second side wall extending between the first end and the second end and disposed opposite the first side wall, a front wall disposed on the first end and extending between the first side wall and the second side wall, a bottom wall extending between the first side wall and the second side wall, the interior compartment at least partially defined by the first side wall, the second side wall, the front wall, and the bottom wall, a first fixture disposed at the first end, and a second fixture disposed at the second end, wherein the second fixture is a guide block fixed to the bottom wall of the carrier tray and disposed at the second end of the carrier tray;
fixing the first end of the SSD to the first fixture of the carrier tray;
fixing a second end of the SSD opposite the first end of the SSD to the second fixture of the carrier tray, the second end of the SSD including a connector;
disposing the second end of the carrier tray toward a carrier slot of a carrier cage, the carrier cage including a peripheral wall defining the carrier slot, a first guide rail projecting from the peripheral wall into the carrier slot, and a second guide rail projecting from the peripheral wall into the carrier slot;
engaging the bottom wall of the carrier tray with the first and second guide rails; and
sliding the carrier tray into the carrier slot until the connector of the SSD is received in a mating connector of a riser board.

16. The method of claim 15, wherein the fixing the first end of the SSD to the first fixture includes sliding opposing edges of the second end of the SSD into respective opposing grooves of the guide block.

17. The method of claim 15, wherein the fixing the second end of the SSD to the second fixture includes:
engaging a bottom surface of the SSD with a protrusion, the protrusion extending from the bottom wall of the carrier tray into the interior compartment of the carrier tray and including a threaded receptacle; and
extending a threaded fastener through an aperture in the SSD and threading the threaded fastener into the threaded receptacle of the protrusion until a head of the threaded fastener engages a top surface of the SSD to fix the SSD between the protrusion and the threaded fastener.

18. The method of claim 15, wherein the sliding the carrier tray into the carrier slot further includes disposing a pin of riser board in a receptacle of the guide block on the carrier tray prior to the mating connector of the riser board receiving the connector of the SSD.

* * * * *